US006843849B1

(12) United States Patent
Sasaki et al.

(10) Patent No.: US 6,843,849 B1
(45) Date of Patent: Jan. 18, 2005

(54) METHOD AND APPARATUS FOR GROWING HIGH QUALITY SINGLE CRYSTAL

(75) Inventors: Takatomo Sasaki, Osaka (JP); Yusuke Mori, Osaka (JP); Masashi Yoshimura, Hiroshima (JP)

(73) Assignee: Japan Science and Technology Corporation, Saitama (JP)

( * ) Notice: Subject to any disclaimer, the term of this patent is extended or adjusted under 35 U.S.C. 154(b) by 0 days.

(21) Appl. No.: 09/979,505

(22) PCT Filed: May 22, 2000

(86) PCT No.: PCT/JP00/03264

§ 371 (c)(1),
(2), (4) Date: Jan. 11, 2002

(87) PCT Pub. No.: WO00/71786

PCT Pub. Date: Nov. 30, 2000

(30) Foreign Application Priority Data

May 22, 1999 (JP) .......................................... 11-178815

(51) Int. Cl.$^7$ ........................... C30B 15/30; C30B 15/00
(52) U.S. Cl. ............................... 117/30; 117/11; 117/13; 117/18; 117/31; 117/200; 117/208; 117/213; 117/217
(58) Field of Search ............................... 117/11, 13, 18, 117/30, 31, 200, 208, 213, 217

(56) References Cited

U.S. PATENT DOCUMENTS

| 4,874,458 A | * 10/1989 | Nishizawa .................... 117/17 |
| 5,126,114 A | * 6/1992 | Kamio et al. ................ 117/213 |
| 5,343,827 A | * 9/1994 | Bordui et al. .................. 117/28 |
| 5,359,452 A | * 10/1994 | Nitanda et al. .............. 359/328 |
| 5,683,281 A | * 11/1997 | Metter ........................ 442/179 |
| 5,788,764 A | * 8/1998 | Sato ............................ 117/28 |
| 5,824,149 A | * 10/1998 | Li ................................ 117/14 |
| 5,868,831 A | * 2/1999 | Dornberger et al. .......... 117/15 |
| 5,871,581 A | * 2/1999 | Atami et al. ................. 117/213 |
| 6,296,784 B1 | * 10/2001 | Sasaki et al. ................ 252/584 |

FOREIGN PATENT DOCUMENTS

| EP | 0786542 A1 | * 7/1997 | ........... C30B/15/00 |
| EP | 786542 | 7/1997 | |
| GB | 2084046 A | * 4/1982 | ........... C30B/15/20 |
| JP | 55-015938 | 2/1980 | |
| JP | 58-208193 | 12/1983 | |
| JP | 63-159284 | * 7/1988 | ........... C30B/15/00 |
| JP | 63190794 A | * 8/1988 | ............ H04R/7/10 |
| JP | 07-277880 | 10/1995 | |
| JP | 08-295507 | 11/1996 | |

OTHER PUBLICATIONS

Patent Abstracts of Japan. English Abstract of JP 63–190794 (1988).*
Abstract of JP 63–159284, Patent Abstracts of Japan (1988).*
Furuya H. et al., "Development of New Nonlinear Optical Crystal GdYCOB with Tunable Birefringence", Nippon Kessho Seicho Gakkaisishi, Vo. 25, No. 5,1998, pp. 193–199.*

* cited by examiner

Primary Examiner—Nadine G. Norton
Assistant Examiner—Matthew Song
(74) Attorney, Agent, or Firm—Wenderoth, Lind & Ponack, L.L.P.

(57) ABSTRACT

In a method for growing a single crystal by bringing a seed crystal (4) into contact with a melt (2) of raw materials melted under heating in a crucible (1) a blade member (5) or a baffle member in disposed in the raw material melt (2) in the crucible (1) and a single crystal is grown by pulling up it with rotating the crucible (1) to thereby grow various single crystals including CLBO from the highly viscous raw material melt (2) as high quality and high performance crystals.

15 Claims, 7 Drawing Sheets

METHOD AND APPARATUS FOR GROWING HIGH QUALITY SINGLE CRYSTAL

TECHNICAL FIELD

The present invention relates to a method and an apparatus for growing a high quality single crystal. Particularly, the present invention relates to a new method for growing a high quality single crystal, the method being capable of growing a high quality single crystal using even highly viscous liquid raw materials and to an apparatus for practicing the method.

BACKGROUND ART

Conventionally, as a method for growing a single crystal of an oxide or the like, a method is known in which raw materials are melted under heating in a crucible, thereafter a seed crystal is brought into contact with the raw material melt and a round bar-like single crystal is pulled up with rotating this seed crystal to grow a single crystal. This pulling method is used for the growth of various single crystals as a method which can grow a large-diameter crystal in an efficient manner.

Also, for example, a method (Kyropoulos method) in known in which raw materials are melted under heating in a crucible, thereafter a seed crystal is brought into contact with the raw material melt and the temperature below liquid level is slowly lowered to precipitate and grow a crystal.

However, in the conventional methods of growing a single crystal by bringing a seed crystal into contact with a raw material melt, there is the problem that when the viscosity of the raw material melt during growth at the required temperature is high, the flow of the raw material melt in the crucible is retarded, causing nonuniformity in temperature, the degree of supersaturation or the like, leading to the result that the quality of the crystal tends to be lowered.

For example. $CsLiB_5O_{10}$ (CLBO) and the like as nonlinear optical crystals attract attention as those for the generation of high output ultraviolet laser light and are desired to have excellent performances and qualities such as very high resistance to damages by lasers, very high optical loss and high uniformity. However, since it is a borate type crystal its melt has a high viscosity which makes it difficult to grow a high quality and high performance single crystal it has been confirmed that in actual measurement, the viscosity of a CLBO solution of a self flux composition is as high as about 1000 cs (centistokes) at a growth temperature, around 840° C.

Figure 7:
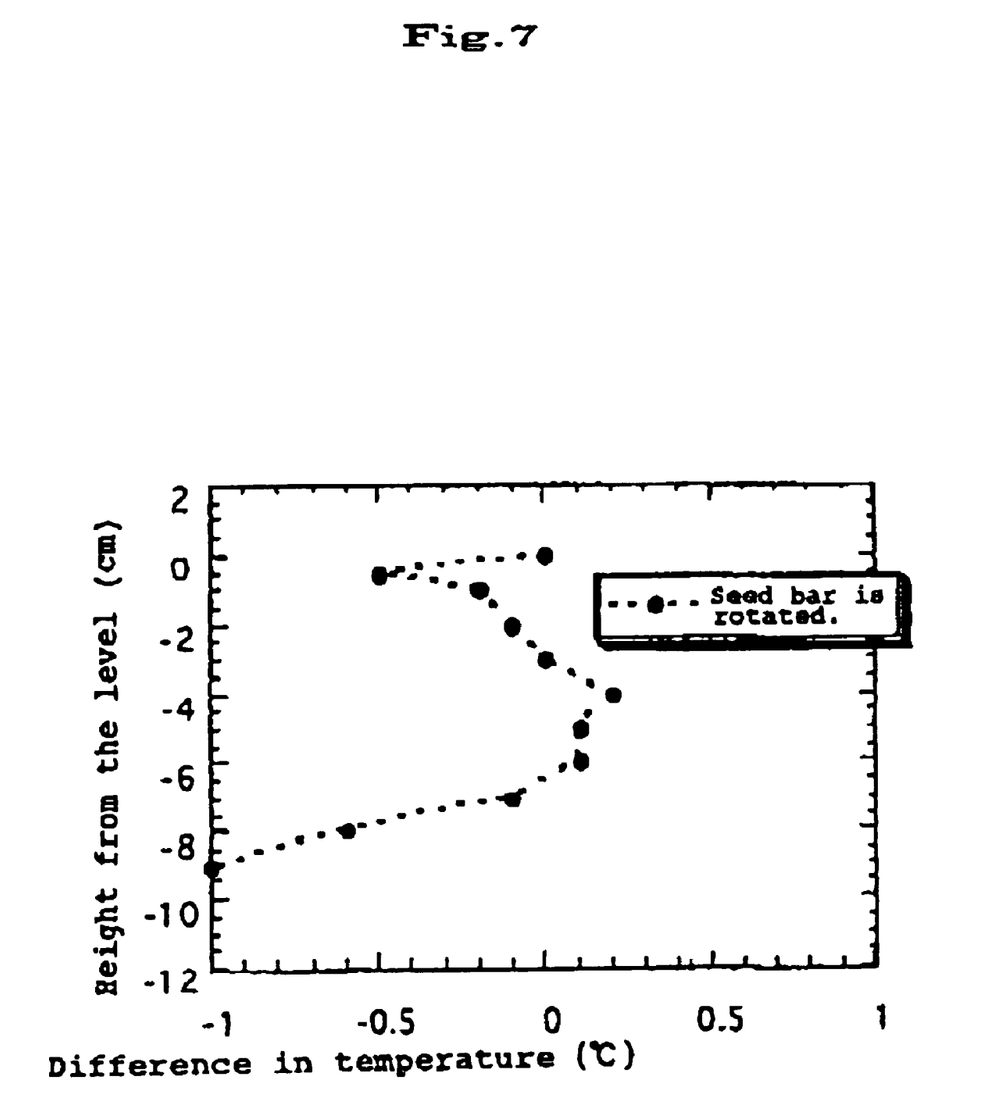
FIG. 7 is a view showing the distribution of temperature in a melt in the case of a conventional method.

For example in the growth of a single crystal by means of the rotation of a seed bar in the CLBO cooling method, the distribution of temperature in the raw material melt is not good an shown in FIG. 7 and the growth of a crystal is rapid and therefore there is a restriction inevitably on the growth of a high quality and high performance crystal.

In view of this situation, it is an object of the present invention to solve the problems in prior art as mentioned above and to provide an improved new method which can grow a high quality and high performance single crystal in the case of using even a highly viscous raw material melt and also to provide an apparatus for practicing the method.

DISCLOSURE OF INVENTION

The present invention has been made to solve the aforementioned problem and, first, provides a method for growing a high quality single crystal, comprising growing a single crystal by bringing a seed crystal into contact with a raw material melt which is heated and melted within a crucible, wherein a blade member or a baffle member is arranged in the raw material melt in the crucible, and the crystal is grown with rotating the crucible without rotating the blade member or the baffle member. Also, the present invention provides, second the method for growing by slowly pulling up the seed crystal which is brought into contact with the raw material melt, third the method for growing by slowly cooling the raw material melt with which the seed crystal makes contact below liquid level to precipitate a single crystal on the surface of the seed crystal, fourth the method wherein the seed crystal is also rotated while rotating the crucible, fifth said method wherein a single crystal of an oxide is grown, sixth the method wherein the single crystal of an oxide is a single crystal of a borate type oxide, seventh the method wherein the borate type oxide is $CsLiB_5O_{10}$ or an oxide obtained by partially substituting at least one of Cs and Li of $CsLiB_5O_{10}$ with at least one type among other alkali metal elements and alkali earth metal elements and eighth the method wherein the oxide is an oxide doped with at least one of Al and Ga elements. The present invention provides, ninth, the method wherein the borate type oxide is represented by $Gd_xY_{1-x}Ca_4O(BO_3)_3$ (0<x<1) and the crystal is grown by a pulling method and tenth the method wherein the single crystal of an oxide is $LiNbO_3$, $LiTaO_3$, a high-temperature superconductive oxide material or a heat-electricity-conversion oxide material.

Further, the present invention provides, eleventh, an apparatus for growing a high quality single crystal by bringing a seed crystal into contact with a raw material melt which is heated and melted within a crucible, comprising a blade member or a baffle member arranged in the raw material melt in the crucible and a rotating material for rotating the crucible, twelfth the growing apparatus comprising a pulling mechanism for slowly pulling up the seed crystal which is brought into contact with the raw material melt, thirteenth the growing apparatus comprising a cooling mechanism for slowly cooling the raw material molt, with which the seed crystal makes contact, below liquid level, fourteenth the apparatus comprising a mechanism for rotating the seed crystal, fifteenth an apparatus for growing a single crystal of an oxide according to any one of the aforementioned growing apparatuses and sixteenth said apparatus for growing a single crystal of a borate type oxide.

The symbols in these figures represent the following parts.

1 Crucible
2 Raw material melt
3 Seed bar
4 seed crystal

5 Blade member
6 Rotating member
7 Support bar

BEST MODE FOR CARRYING OUT THE INVENTION

The present invention has the characteristics as aforementioned and embodiments of the invention will be hereinafter explained.

First, a method for growing a single crystal according to the present invention is based upon the ground that a seed crystal is brought into contact with a malt of raw materials melted under heating in a crucible to grow a single crystal. In the growing method of this invention, various modes such as a conventionally known pulling method and a cooling method (Kyropoulos method) using gradual cooling are optionally adopted. The point that the seed crystal is brought into contact with the melt (including the case of a malt) produced by melting raw materials to grow a single crystal is common to all of these modes.

Figure 1:
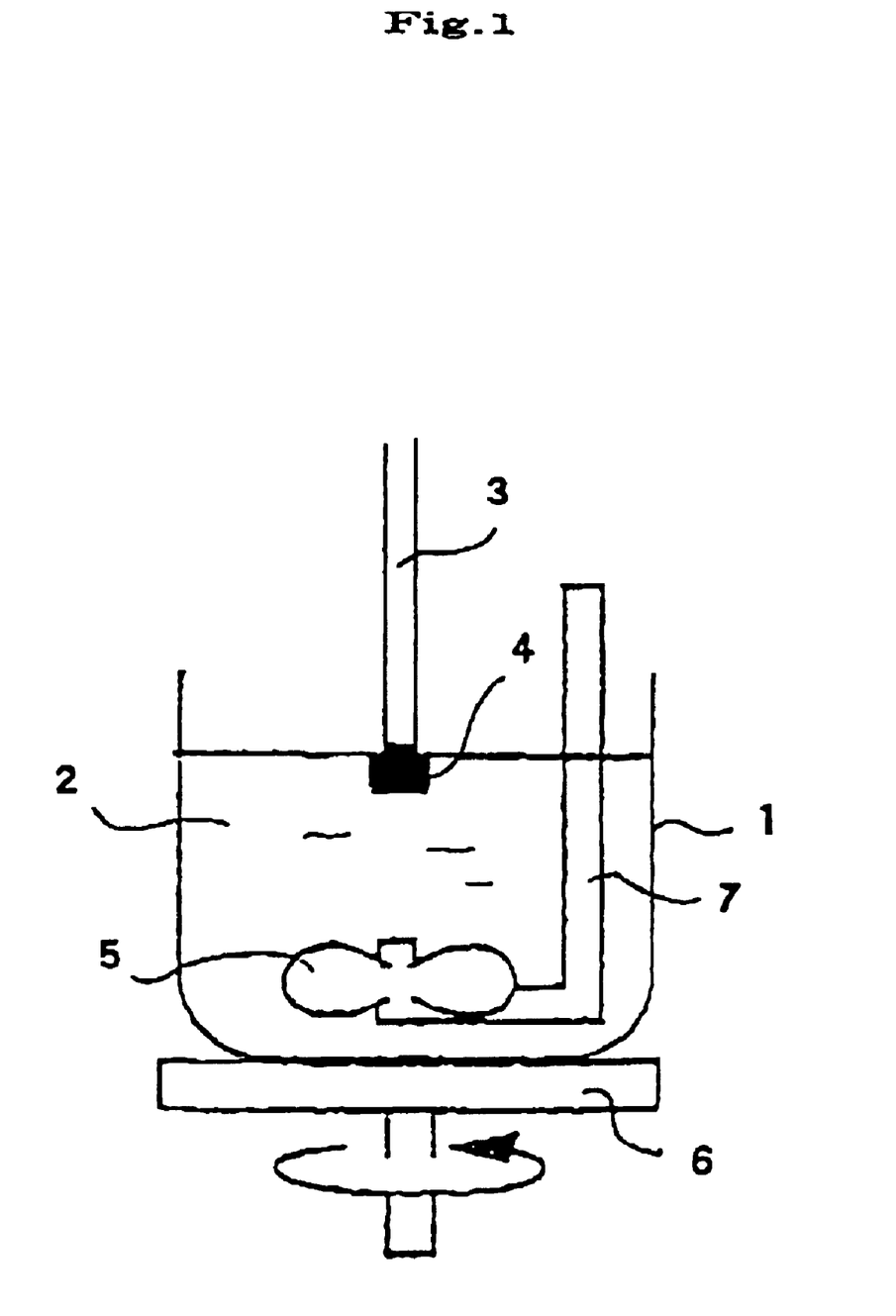
FIG. 1 is a structural view showing the outline of a method and an apparatus according to this invention.

When practicing the method of this invention, a growing apparatus basically comprises a crucible, a heating means for heating and melting raw materials placed in the crucible, a means for detecting and controlling heating temperature and a crystal support means for bringing a seed crystal into contact ith a melt (including a melt) of the raw materials which are melted under heating. As shown in FIG. 1 showing the typical view of the apparatus, the present invention has the characteristics that when a seed crystal (4) supported by a crystal support means such as a seed bar (3) is brought into contact with a melt (2) of raw materials melted under heating in a crucible (1) to grow a single crystal, a blade member (5) or a baffle member is disposed in the raw material melt (2) in the crucible (1) and the crucible is rotated to grow the single crystal. For the rotation of the crucible (1), the growing apparatus is provided with a rotating material (6) which rotates the crucible (1) in the condition chat the crucible (1) is mounted thereon.

In the case of a pulling method, the seed bar (3) is pulled up towards above with rotating the seed bar (3) or in such a stationary state that the seed bar (3) is not rotated. On the other hand, in the case of the cooling method, for example, a method in which using a hollow seed bar (3), cooling gas is supplied to the hollow portion and the raw material melt below liquid level is cooled slowly to precipitate a single crystal on the surface of the seed crystal (4), thereby growing a single crystal or a method in which the temperature of whole heaters in a furnace is slowly lowered to cool the temperature of the raw material molt below liquid level may be adopted. The former method is used to prevent the seed crystal from being melted. In these cases, the support means such as the seed bar (3) may also be either rotated or be in such a stationary state that the seed bar (3) is not rotated. It is to be noted that the present invention has, as its basic thought, the characteristics that the rotations of the seed bar (3) as aforementioned and seed crystal (4) which are supported by the seed bar (3) are made to be unessential and the crucible (1) in rotated, whether the seed bar (3) and the seed crystal (4) are rotated or not is determined properly according to the need as a relative motion to the rotation of the crucible (1).

In the present invention, the blade member (5) or the baffle member itself may be in a stationary state whereas the crucible (1) is designed to be rotated by the rotating material (6) in the raw material melt (2) as shown in, for example, FIG. 1.

The presence of the blade member (5) or baffle member having such characteristics and the rotation of the crucible (1) enhance the effect of stirring the raw material melt, which makes it possible to make thin the diffusion boundary layer, to increase the amount of the raw materials to be supplied to the growth surface and to make the degree of supersaturation uniform. This enables the growth of a high quality and high performance single crystal even if the raw material melt in highly viscous at the growth temperature.

The blade member (5) or baffle member as those having various shapes may be arranged in consideration of the composition and type of single crystal which is a subject of growth and raw material, the composition and viscosity of the raw material melt, further the depth of the above member inserted into the raw material melt (2), a distance from the rotation center oc the crucible (1), the flow direction and flow speed of the raw material melt (2) and the like. As preferable examples of the blade member (5) or baffle member, plural blades are arranged radially and fixed at the center of them. Namely, those made to have a screw form and those obtained by arranging plural baffle plate fragments are exemplified.

Although these blade member (5) and baffle member is not rotated but placed in a stationary state, vibrations and motions such as reciprocating motions in at least one of a vertical direction and a horizontal direction may be imparted to these members. Also, as shown in FIG. 1, the blade member (5) or baffle member may be inserted into the crucible (1) from the above and pulled up by the support bar (7), may be disposed such that, for example, the depth of the member to be arranged in the raw material melt (2) can be adjusted and may be fitted and fixed to the bottom or the like of the crucible (1). More preferably, it is considered to make the member have the former structure.

As to the rotation of the crucible (1) by means of the rotating material (6), it is considered that the crucible (1) is made to be able to rotate in a direction positive with respect to the direction of the rotation of the seed crystal (4) or in both directions reversely. Also, regarding the rotation of the crucible (1), it in considered to change the rate of rotation under control during the course of the growth. It is also considered that the direction of rotation and the rate of rotation are changed under control in relation to optical detection of, for example, the flow and temperature of the melt and growth size of the single crystal or to pressure sensitive and heat-sensitive detection of, for example, the flow and temperature of the melt at the blade member (5) or the support bar (7) in the crucible (1).

The single crystal which is an object of this invention may be various types and this invention is more effective when the raw material melt is highly viscous at growth temperatures. As examples of the single crystal, various oxides are given. Particularly, this invention is suitable for the growth of highly viscous borate type crystal such as $CsLiB_5O_{10}$ (CLBO) for which a high quality and high performance single crystal is expected, compositions prepared by partially substituting at least one of Cs and Li of $CsLiB_5O_{10}$ with one of other alkali metal elements or alkali earth metal atoms or those doped with an atom such as Al or Ga. In an example explained later, explanations are offered taking, as an example, the case where the above CLBO is grown by a cooling method, though the invention is not limited to this case.

Also in the growth of a crystal of GdYCOB, namely, $Gd_xY_{1-x}Ca_4O(BO_3)_3$ by a pulling method (Czochralski method: Cz method), a high quality crystal is obtained by the method of this invention. In the pulling method in particular, it is also effective to dispose the baffle member.

Also, as the oxides to be grown. $LiNbO_3$, $LiTaO_3$, high-temperature superconductive oxide materials and heat-electricity conversion oxide materials such as $Na_xCO_2O_4$ (x is about 1) are also exemplified.

Now, the present invention will be explained in more detail by way of examples shown below.

EXAMPLES (Growing Apparatus)

Figure 2:
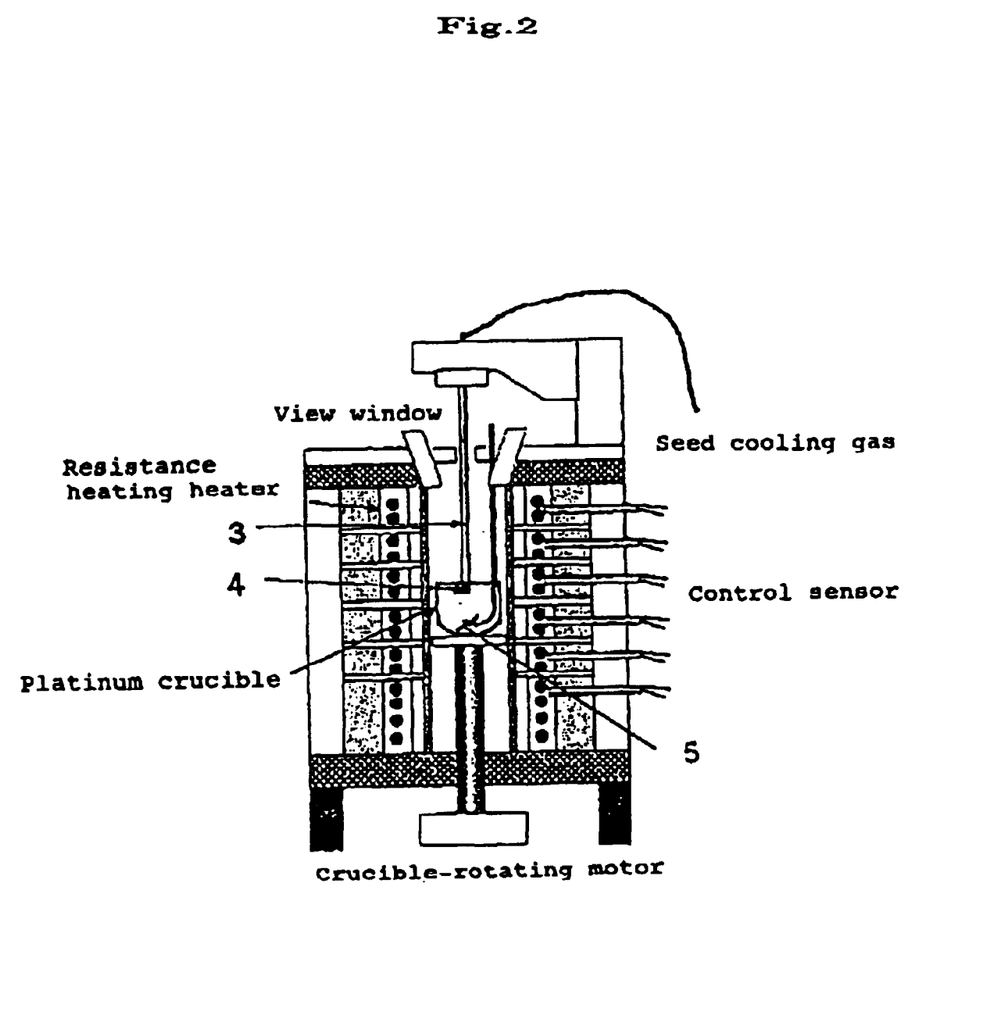
FIG. 2 is a sectional view showing a growing apparatus as an example.

As a growing apparatus, the whole was designed to have the structure of FIG. 2. Using a platinum crucible, the crucible was designed to be able to be rotated by a motor. Also, in this apparatus, a hollow one was used as a seed bar (3), a seed crystal (4) was supported by the lower nd of the seed bar (3) and the seed crystal (4) was designed to be capable of being cooled by supplying seed-cooling gas to the inside of the hollow seed bar (3). This prevented the seed crystal (4) from melting and falling. This apparatus enables growth using a melt composition which conventionally involves a difficulty in the growth of a crystal because the seed crystal melts.

Figure 3:
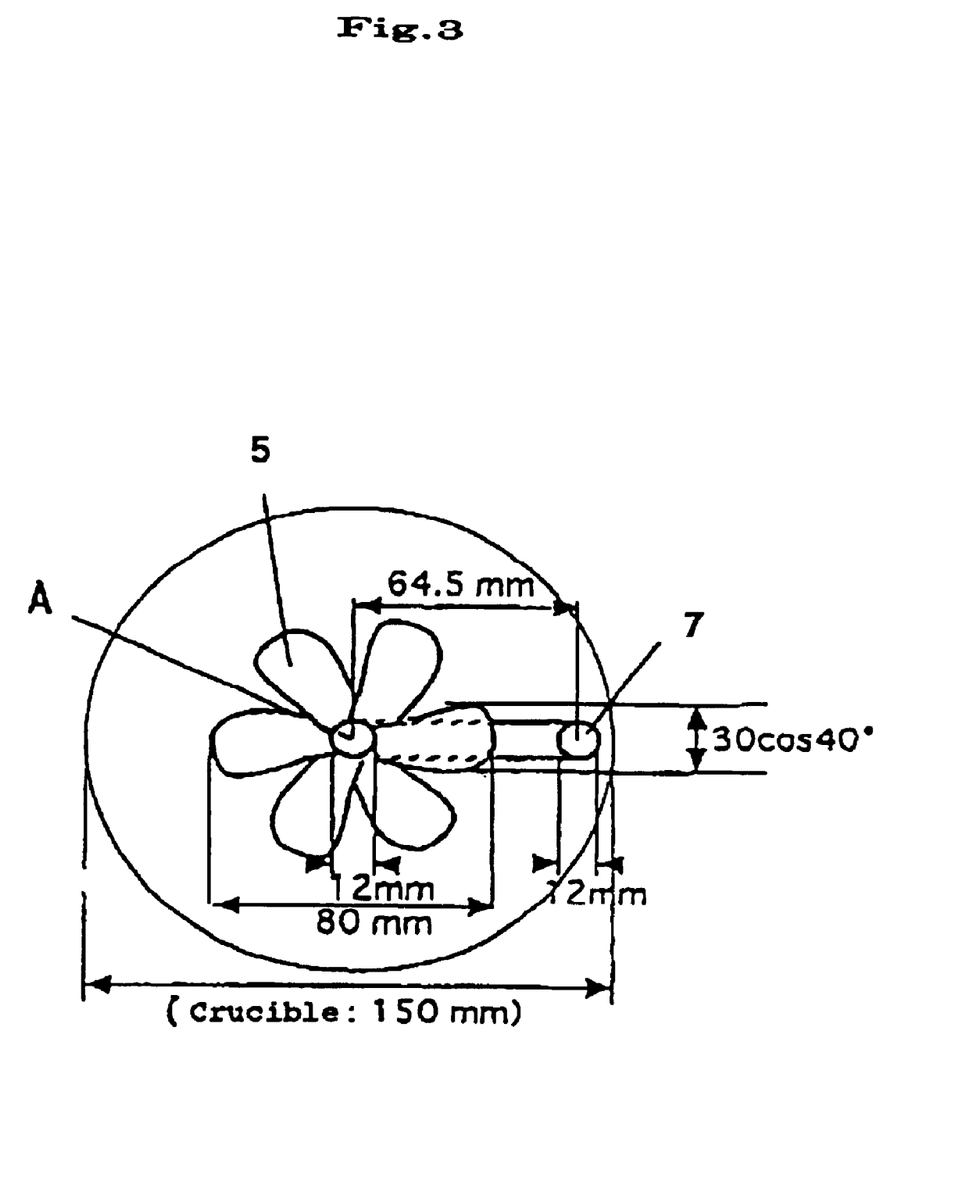
FIG. 3 is a plan view illustrating a blade member.
Figure 4:
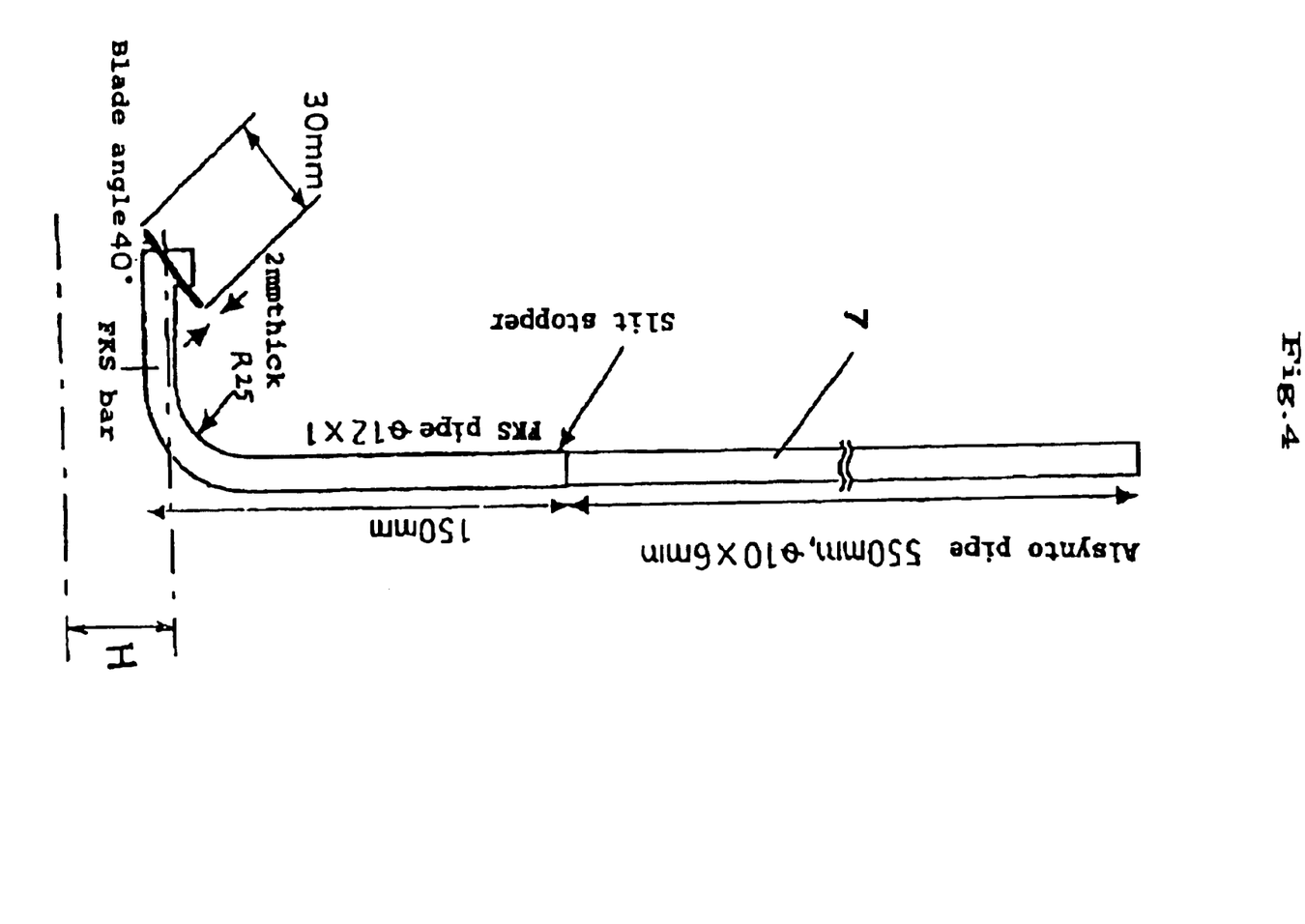
FIG. 4 is a side view of a blade member.

In the platinum crucible, a screw type blade member (5) made of platinum shown in FIG. 3 and FIG. 4 was disposed by fitting it to the support bar (7). The blade member (5) had six blades which were arranged at a blade angle of 40 degrees. The blade member (5) was arranged such that the center (A) of the blade was disposed at a plane position corresponding to the center of rotation of the crucible. The distance (H) from the inside bottom of the crucible to the center (A) of the blade was designed to be capable or being controlled. It is to be noted that as to the distance (H), the center (A) of the blade was designed to be positioned as close as possible to the inside bottom of the crucible.

It is to be noted that both of the Alsynto pipe and FKS pipe shown in FIG. 4 were purchased from FURUYAMETAL CO. LTD.). The Alsynto pipe was made of alumina ($Al_2O_3$) as its primary raw material and the FKS pipe was constituted of a material comprising platinum (Pt) containing $ZrO_2$.

(Single Crystal Growth)

Using the aforementioned growing apparatus, the crucible was rotated to grow a CLBO single crystal by a cooling method.

The seed bar was not rotated and similarly the blade member was not rotated to make growth in a stationary state. The raw material melt was made to have a CLBO self flux composition. The percentage composition of this self flux was as follows: Cs:Li:B:O=1:1:5.5:9.2. Also, it has been confirmed that this composition is preferably a stoichiometric composition (melt composition). The maximum heating temperature of the raw material melt was set to 90° C.

Each condition of temperature descending rate and the rotation of the crucible was as follows.

Temperature Descending Rate 0.1° C./day

Rotation of the Crucible 30 rpm

The position where the temperature descending rate was measured was the level of the melt as the first standard. Thereafter, the temperature of the melt was made to descend at a rate of 0.1° C./day from the temperature at the level. The temperature at this time was measured by control sensors shown in FIG. 2 and the temperature of the whole melt was made to descend equally at a rare of 0.1° C./day.

Figure 5:
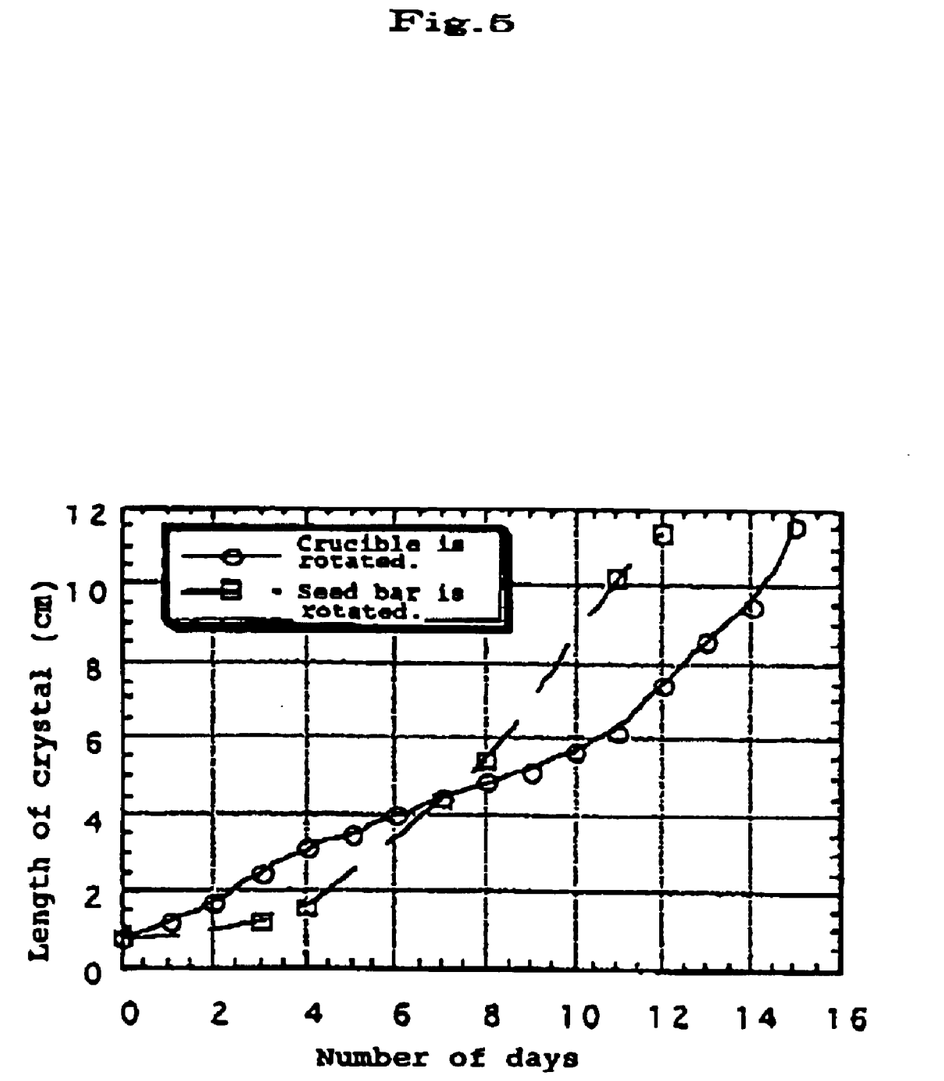
FIG. 5 is a view showing the hysteresis of crystal growth.
Figure 6:
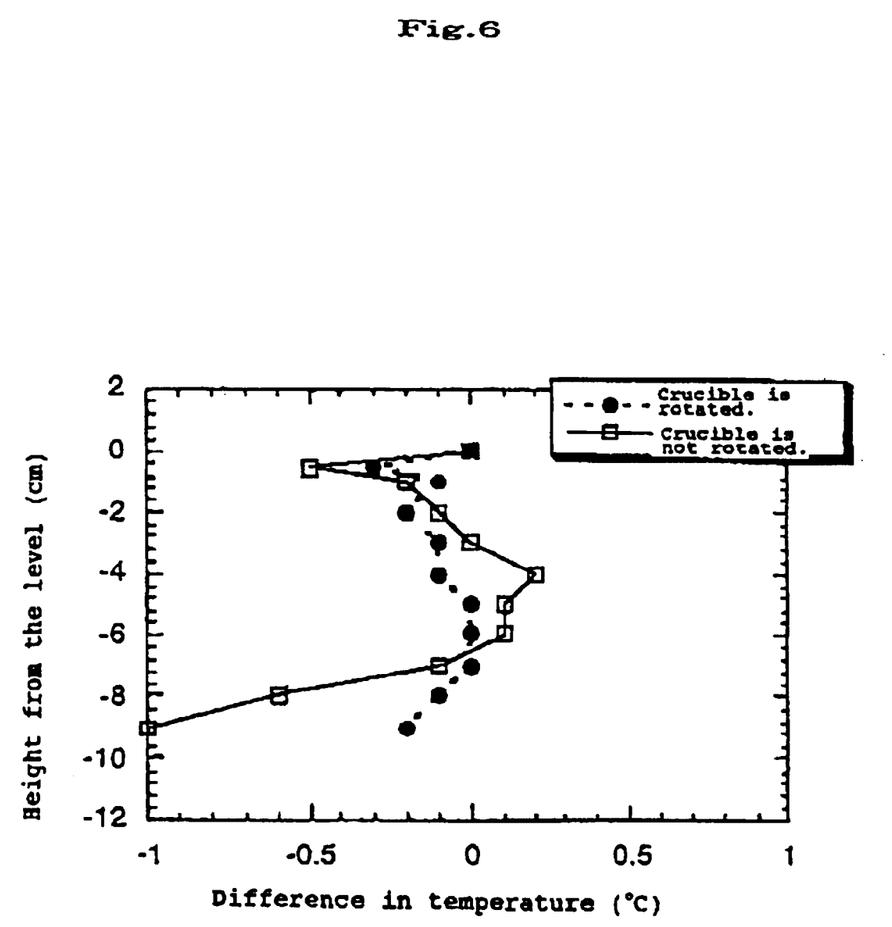
FIG. 6 is a view showing the distribution of temperature in a raw material melt.

FIG. 5 shows the hysteresis of the crystal when compared with that of a conventional usual method and FIG. 6 shows the distribution of temperature in the raw material melt. It is understood from FIG. 6 that the distribution of temperature of the melt in the crucible is made more uniform in the direction of the height than that of a conventional method and the crystal is grown uniformly.

Further studies as to the results of the distribution of temperature in the raw material malt in FIG. 6 proved it desirable for the growth of a high quality crystal that a difference (Δt) in temperature between positions extending from the liquid level up to a height (depth) of about 10 cm was in a range of up to −0.5° C., namely between −0.5° C. to 0° C.

Also, as shown in FIG. 5, in the conventional growing method, although a growth at the first start is slow, the rate of growth rises on the way and the final rate of growth becomes considerably high. This shows that when a crystal is small, a poor stirring effect is produced even if a seed bar is rotated whereas when a crystal is large, the crystal itself stirs a melt to thereby accelerate the growth instantly.

On the contrary, in the growth according to the method of this invention in which the blade member is inserted and the crucible is rotated, a growth at the first start is faster than in the case of the conventional growth using the rotation of a seed bar. Thin is because the melt is sufficiently stirred by the rotation of the crucible and therefore a layer called the diffusion boundary layer which determines the rate of growth becomes thin. Further, this is because the degree of supersaturation is made uniform.

(Evaluation of Crystals)

In order to evaluate the quality of the grown crystal, samples prepared by cutting the crystal into wafer-like shapes 1.5 cm in thickness and polishing the three-planes of the cut crystal were subjected to a test using a He—Ne laser to observe the internal diffusion in the crystal. In the crystals having high qualities, diffusion arises in the inside and the inside is bright with red light, so that the points of diffusion were seen. In deficient places, passes were viewed.

As a result of the observation, it was confirmed that the crystal grown according to the method of this invention in which the blade member was inserted and the crucible was rotated had good qualities and a few passes were viewed at the lower portion of the need crystal.

On the other hand, in the crystals grown by the conventional method, passes were viewed as a whole, giving rise to a problem concerning the qualities of the crystal.

Also, as samples for the evaluation of resistance to a laser, the same samples as above and crystals 10 mm×10 mm×15 mm in size which were grown by the conventional method were used. The measurement of damage threshold value was made for the (001) plane. As the laser light source, a longitudinal and lateral single mode Q switch Md:YAG laser was used. The evaluation was made using an oscillation wavelength of 266 nm which was fourth harmonics of the Nd:YAG laser. The pulse width was 0.75 ns.

Light having a diameter of 8 mm was converged using a lens with a focal distance of 100 mm. Here, the position of the crystal was adjusted such that the focus portion was located at a distance of 5 mm from the plane of incidence and the crystal was moved every shot. It has been confirmed that no damage is produced on the plane of incidence in the light conversion condition in this case. Continuous light of a He—Ne laser was allowed to pass on the same axis of the Nd:YAG laser to confirm whether a diffusion point was present or not on the portion irradiated with the laser light every movement and to examine visually whether or not diffusion points newly occurred after the shot to thereby determine whether damages were present or not. When the incident energy is higher than the damage threshold value, plasma was observed at the light convergence portion. In the vicinity of the threshold value, the occurrence of diffusion points was only confirmed. The intensity of the laser pulse was changed by a combination of a λ/2 plate (polarization rotor) and a polaroizer. The incident energy was monitored by a biplanaphoto tube and an oscilloscope which were calibrated by a calorimeter. Fused quartz (10.4 GW/cm$^2$) was used as a reference example.

The internal laser damage threshold value was measured using the fourth harmonics (266 nm) of an Nd:YAG laser in such procedures. The internal laser damage threshold value of the crystal grown according to this invention in which the blade member was inserted and the crucible was rotated and the internal laser damage threshold values of the crystal grown by the conventional method and fused quartz are shown in Table 1.

TABLE 1

| Method | Damage threshold value (GW/cm$^2$) |
|---|---|
| Fused quartz | 10.4 |
| Conventional method | 8.8–9.9 |
| This invention | 10.4–20.8 |

As shown in Table 1, it was confirmed that the internal laser damage threshold value of the crystal grown by the conventional growing method was lower than that of fused quartz whereas the internal laser damage threshold value of the crystal grown according to the method of this invention in which the blade member was inserted and the crucible was rotated was higher than that of fused quartz even when the threshold value was lower and was about two times that of fused quartz when the threshold value was the highest.

As mentioned above, when comparing the internal laser damage threshold value of the crystal grown by the conventional method with that of the crystal grown by the method of this invention, it is understood that the crystal of this invention is considerably higher than the conventional crystal in the internal laser damage threshold value. This means that the crystallinity is significantly improved.

INDUSTRIAL APPLICABILITY

As mentioned above in detail, the present invention ensures that various single crystals including CLBO are grown as high quality and high performance crystals from a highly viscous raw material melt.

What is claimed is:

1. A method of growing a single crystal comprising:
   bringing a seed crystal into contact with a raw material melt which is heated and melted within a crucible by a resistance heating heater and growing a single crystal; and
   rotating the crucible without rotating a blade member having a screw form in the crucible in the raw material melt during said growing, the blade member being located at a position corresponding to the center of rotation of the crucible and adjacent to the inside bottom of the crucible, so as to stir the raw material melt in the crucible;
   wherein said growing a single crystal includes slowly cooling the raw material melt with which the seed crystal makes contact below a liquid level of the raw material melt to precipitate the single crystal on the surface of the seed crystal such that a difference in temperature of the raw material melt between different positions along an extent from the liquid level to a depth of 10 cm is in a range of −0.5° to 0° C.

2. The method of claim 1, wherein the seed crystal is rotated during said rotating the crucible.

3. The method of claim 2, wherein said growing comprises growing a single crystal of an oxide.

4. The method of claim 3, said growing a single crystal of an oxide comprises growing a single crystal of a borate type oxide.

5. The method of claim 4, wherein the borate type oxide is $CsLiB_5O_{10}$ or an oxide obtained by partially substituting at least one of Cs and Li of $CsLiB_5O_{10}$ with at least one type among other alkali metal elements and alkali earth metal elements.

6. The method of claim 5, wherein the oxide is doped with at least one of Al and Ga elements.

7. The method of claim 4, wherein the borate type oxide is represented by $Gd_xY_{1-x}Ca_4O(BO_3)_3$ (0<x<1) and said growing comprises a pulling method.

8. The method of claim 3, wherein the single crystal of an oxide is $LiNbO_3$, $LiTaO_3$, a high-temperature superconductive oxide material or a heat-electricity-conversion oxide material.

9. The method of claim 1, wherein said growing comprises growing a single crystal of an oxide.

10. The method of claim 9, said growing a single crystal of an oxide comprises growing a single crystal of a borate type oxide.

11. The method of claim 10, wherein the borate type oxide is $CsLiB_5O_{10}$ or an oxide obtained by partially substituting at least one of Cs and Li of $CsLiB_5O_{10}$ with at least one type among other alkali metal elements and alkali earth metal elements.

12. The method of claim 11, wherein the oxide is doped with at least one of Al and Ga elements.

13. The method of claim 10, wherein the borate type oxide is represented by $Gd_xY_{1-x}Ca_4O(BO_3)_3$ (0<x<1) and said growing comprises a pulling method.

14. The method of claim 9, wherein the single crystal of an oxide is $LiNbO_2$, $LiTaO_2$, a high-temperature superconductive oxide material or a heat-electricity-conversion oxide material.

15. The method of claim 1, wherein said cooling comprises cooling the raw material melt with a temperature drop rate of 0.1° C./day.

* * * * *